(12) United States Patent
Gatewood et al.

(10) Patent No.: US 8,340,914 B2
(45) Date of Patent: Dec. 25, 2012

(54) METHODS AND SYSTEMS FOR COMPRESSING AND COMPARING GENOMIC DATA

(76) Inventors: Joe M. Gatewood, Santa Fe, NM (US);
Valerio G. Aimale, Santa Fe, NM (US);
Callum J. Bell, Santa Fe, NM (US)

( * ) Notice: Subject to any disclaimer, the term of this patent is extended or adjusted under 35 U.S.C. 154(b) by 1255 days.

(21) Appl. No.: 11/667,264

(22) PCT Filed: Nov. 8, 2004

(86) PCT No.: PCT/US2004/037039
§ 371 (c)(1),
(2), (4) Date: Nov. 16, 2007

(87) PCT Pub. No.: WO2006/052242
PCT Pub. Date: May 18, 2006

(65) Prior Publication Data
US 2008/0077607 A1    Mar. 27, 2008

(51) Int. Cl.
*G06F 7/00* (2006.01)
(52) U.S. Cl. ............... 702/19; 702/20; 703/11; 707/700
(58) Field of Classification Search .................. None
See application file for complete search history.

(56) References Cited

U.S. PATENT DOCUMENTS

| 7,211,388 B2 * | 5/2007 | Cash et al. | ..................... 435/6.1 |
| 7,657,383 B2 | 2/2010 | Allard et al. | |
| 2008/0125978 A1 | 5/2008 | Robson et al. | |

OTHER PUBLICATIONS

Chen et al. (Chen et al. IEEE Engineering in Medicine and Biology 2001, vol. 20, No. 4 61-66, PTO_1449).*
Chen et al.; "A Compression Algorithm for DNA Sequences"; IEEE Engineering in Medicine and Biology, pp. 61-66, Jul./Aug. 2001.
Chen et al.; "DNACompress: Fast and Effective DNA Sequence Compression"; Bioinformatics Application Note, vol. 18, No. 12, pp. 1696-1698, (2002).
Rivals et al.; "Detection of Significant Patterns by Compression Algorithms: The Case of Approximate Tandem Repeats in DNA Sequences"; CABIOS Computer Applications in the Biosciences, vol. 13, No. 2, pp. 131-136, (1997).
Burns; "Differential Compression: A Generalized Solution for Binary Files"; Master Thesis, University of California, Santa Cruz, pp. 1-69, Dec. 1996.
Reese et al., "A Standard Variation File Format for Human Genome Sequences," Genome Biology 2010, 11:R88.
Christley et al., "Human Genomes as Email Attachments," Bioinformatics, vol. 25, No. 2, 2009, pp. 274-275; doi:10.1093/bioinformatics/btn582.
Brandon et al., "Data structures and compression algorithms for genomic sequence data," Bioinformatics, vol. 25, No. 14, 2009, pp. 1731-1738; doi:10.1093/bioinformatics/btp319.
Li et al., "The Sequence Alignment/Map format and SAMtools," Bioinformatics, vol. 25, No. 16, 2009, pp. 2078-2079; dio:10.1093/bioinformatics/btp352.
Bell et al., "Evaluation of delta compression of nucleic acid sequences," Manuscript ID: BIOINF-2010-1774, 4 pages.
E-mail communication from Bioinformatics Editorial Office dated Jan. 30, 2011 to co-inventor C. Bell, forwarding comments on submitted Manuscript ID: BIOINF-2010-1774, entitled "Evaluation of delta compression of nucleic acid sequences," 2 pages.

* cited by examiner

*Primary Examiner* — Mary Zeman
(74) *Attorney, Agent, or Firm* — Finnegan, Henderson, Farabow, Garrett & Dunner, L.L.P.

(57) ABSTRACT

Systems and methods are disclosed for compressing and comparing data such as genomic data. The disclosed systems and methods may include selecting a segment, creating a delta representation of the segment, the delta representation comprising a script, and storing the script. Furthermore, the disclosed systems and methods may include receiving a first script comprising a compressed version of a first segment and receiving a second script comprising a compressed version of a second segment. The disclosed systems and methods may further include comparing the first script to the second script and determining if the first segment matches the second segment based upon the comparison of the first script to the second script.

29 Claims, 23 Drawing Sheets

⟨*⟩≡
   ⟨Preamble⟩
   ⟨Argument Options⟩
   ⟨Open Files⟩
   ⟨Collecting Unique Aligned Segments from Mummer Output⟩
   ⟨Sort Mummer Output⟩
   ⟨Overlapping MUMs Resolutions⟩
   ⟨Delta Outputting Loop⟩;

*FIG. 6*

```
SEGMENT ID: test
MINMATCH: 1
LENGTH: 70
DATA: ttcttttctgtgatgtgtcccttacctctaataatacttttcttcttaaagtctacttcattaaaaatag
  15261 1 70
OK. (Thread 0)
```
[SEQ ID NO 1]

FIG. 7

```
# reading input file "References/NT_011520.9" of length 23178213
# construct suffix tree for sequence of length 23178213
# (maximum input length is 536870908)
# process 231782 characters per dot
#..........................................
# CONSTRUCTIONTIME bin/mummer References/NT_011520.9 31.25
# reading input file "Segment" of length 23218593
# matching query-file "Segment"
# against subject-file "References/NT_011520.9"
> Hs22_11677
       1           1         1541
    1545        1545         1331
    3076        3079          606
    3682        3688          637
    4316        4323          966
    5286        5289           95
    5379        5383           42
    5429        5433         1773
    7209        7206          162
    7370        7370          278
    7648        7649         2914
   10561       10561          935
   11497       11496          788
   12405       12412         1594
   13997       14007          527
   14528       14533         2371
   16899       16907         2645
   19551       19552          252
   19800       19804          203
   19996       20007           74
   20070       20082         1335
   21412       21417          687
   22098       22104          192
   22290       22297         1156
   23512       23516         1002
   24514       24521          285
   24798       24808         1448
   26246       26259          942
   27187       27201          518
   27705       27722          811
   28513       28533          600
   29117       29133           96
   29216       29232          524
   29740       29765          891
   30632       30656         3566
   34198       34226         2587
[...]
```

*FIG. 8*

```
1: Copy from 1 for 1541 nucleotides
1542: Insert at 1542 Fragment fragment-00000000.fasta
1545: Copy from 1545 for 1531 nucleotides
3076: Copy from 12219866 for 10 nucleotides
3086: Copy from 3083 for 599 nucleotides
3685: Insert at 3685 Fragment fragment-00000001.fasta
3688: Copy from 3682 for 637 nucleotides
4325: Copy from 4318 for 964 nucleotides
5289: Copy from 5286 for 95 nucleotides
5384: Copy from 5380 for 41 nucleotides
5425: Insert at 5425 Fragment fragment-00000002.fasta
5433: Copy from 5429 for 1773 nucleotides
7206: Copy from 7209 for 162 nucleotides
7368: Insert at 7368 Fragment fragment-00000003.fasta
7370: Copy from 7370 for 278 nucleotides
7648: Insert at 7648 Fragment fragment-00000004.fasta
7649: Copy from 7648 for 2914 nucleotides
10563: Copy from 10563 for 933 nucleotides
11496: Copy from 11497 for 788 nucleotides
12284: Insert at 12284 Fragment fragment-00000005.fasta
12403: Copy from 17361577 for 14 nucleotides
12417: Copy from 12410 for 1589 nucleotides
14006: Insert at 14006 Fragment fragment-00000006.fasta
14007: Copy from 13997 for 527 nucleotides
14534: Copy from 14529 for 2370 nucleotides
16904: Insert at 16904 Fragment fragment-00000007.fasta
16907: Copy from 16899 for 2645 nucleotides
19552: Copy from 19551 for 252 nucleotides
19804: Copy from 19800 for 203 nucleotides
20007: Copy from 19996 for 74 nucleotides
20081: Insert at 20081 Fragment fragment-00000008.fasta
20082: Copy from 20070 for 1335 nucleotides
21417: Copy from 21412 for 687 nucleotides
22104: Copy from 22098 for 192 nucleotides
22296: Insert at 22296 Fragment fragment-00000009.fasta
22297: Copy from 22290 for 1156 nucleotides
23453: Insert at 23453 Fragment fragment-00000010.fasta
23516: Copy from 23512 for 1002 nucleotides
24518: Copy from 21670611 for 10 nucleotides
24528: Copy from 24521 for 278 nucleotides
24806: Insert at 24806 Fragment fragment-00000011.fasta
24808: Copy from 24798 for 1448 nucleotides
26256: Insert at 26256 Fragment fragment-00000012.fasta
26259: Copy from 26246 for 942 nucleotides
27201: Copy from 27187 for 518 nucleotides
27719: Insert at 27719 Fragment fragment-00000013.fasta
[...]
```

FIG. 10

| Test | General I/O | Comparison | Total Time |
|---|---|---|---|
| C Program comparing sequences in database | 0.01 | 0.21 | 0.22 |
| C Program comparing flat files | 4.93 | 0.04 | 4.97 |
| Perl program comparing sequences in database | 0.41 | 0.33 | 0.74 |
| Perl program comparing flat files | 2.91 | 0.05 | 2.96 |
| Perl program querying Genbank | 154.00 | 0.05 | 154.05 |

*FIG. 23*

SEQUENCE LISTING

```
<160> NUMBER OF SEQ ID NOS: 10

<210> SEQ ID NO 1
<211> LENGTH: 70
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 1
ttcttttctg tgatgtgtcc cttacctcta ataatacttt tcttcttaaa gtctacttca        60
ttaaaaatag                                                               70
```

```
<210> SEQ ID NO 2
<211> LENGTH: 40
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 2
ggtgaaaccc catctctact aaaaatacaa aaattagctg                             40

<210> SEQ ID NO 3
<211> LENGTH: 40
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 3
ggtgaaaccc atctctacta aaaatacaaa aattagctgg                             40

<210> SEQ ID NO 4
<211> LENGTH: 19
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 4
aggttccttg gcctttaaa                                                    19

<210> SEQ ID NO 5
<211> LENGTH: 18
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 5
tttgggcctt ggacctgg                                                     18

<210> SEQ ID NO 6
<211> LENGTH: 17
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 6 tttgggggc cttaacc                                                       17

<210> SEQ ID NO 7
<211> LENGTH: 15
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 7
aaaccttggt ttggg                                                        15
```

```
<210> SEQ ID NO 8
<211> LENGTH: 15
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 8
tttgggattg ggaaa                                                    15

<210> SEQ ID NO 9
<211> LENGTH: 14
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 9
tttgggaaag ggtt                                                     14

<210> SEQ ID NO 10
<211> LENGTH: 10
<212> TYPE: DNA
<213> ORGANISM: Artificial Sequence
<220> FEATURE:
<223> OTHER INFORMATION: Description of Artificial Sequence: Synthetic
      oligonucleotide

<400> SEQUENCE: 10
gtgtgtgtgt                                                          10
```

METHODS AND SYSTEMS FOR COMPRESSING AND COMPARING GENOMIC DATA

GOVERNMENT LICENSE RIGHTS

The U.S. Government may have a paid-up license in portions of this invention and the right in limited circumstances to require the patent owner to license others on reasonable terms as provided for by the terms of National Institutes of Health Grant No. 1R44 HG003295-01 awarded by the National Human Genome Research Institute.

BACKGROUND OF THE INVENTION

I. Field of the Invention

The present invention generally relates to methods and systems for compressing genomic data. More particularly, the present invention relates to compressing genomic data using, for example, delta compression processes.

II. Background Information

Current social, medical, and scientific thinking converges on the idea of "personalized medicine", broadly interpreted as tailoring clinical decision making based on a patient's genetics. Genetic makeup can not only determine predisposition to disease, but also how the body reacts to various treatment modalities. Mutations in approximately 1,200 (about 3% of the estimated human gene complement) result in Mendelian genetic disease. Genetic factors involved in multifactorial diseases, where familial associations are a factor, such as Type 2 diabetes and cardiovascular disease, are far more numerous. Phenomena such as susceptibility to infection, to fracture, and the aging process are also believed to have a genetic foundation. Accordingly, there is a need for a better understanding of human genetic variation, influence of variation on predisposition to disease, and response to therapy.

Progress towards these goals has been made possible by large scale single nucleotide polymorphism (SNP) discovery projects. Linkage disequilibrium (LD) studies of SNP variation and disease phenotypes appear to hold promise for identifying mutations in genes that underlie disease. SNP genotyping approaches, however, are at best sampling methods, and efforts to optimize them are mostly driven by the need to minimize costs. With affordable on-demand complete human genome sequencing, full knowledge of genomic variation may become possible. When this occurs, the promise of medical decision-making based on individual genetic risk may be realized.

The United States federal government has acknowledged the need to reduce the cost of sequencing a human genome from a staggering $10-$50 million to below $1,000. This may bring the cost more in line with the cost of a clinical test. Cost effective deoxyribonucleic acid (DNA) sequencing technologies may require information systems capable of efficient storage and manipulation of many thousands of fully-sequenced individual genomes. Human genomes are large, occupying upwards of $6 \times 10^9$ bytes each. Although computer storage media are relatively inexpensive, the number of people that may have their genomes sequenced may pose data storage problems. Moreover, problems may be encountered with input/output (I/O) times required to read and write genome sequences to storage devices, and in transmitting genome sequences over networks. Furthermore, the intercomparison of genome sequences poses a challenge. There are currently no methods or systems capable of dealing with the problems this data volume poses.

Accordingly, there is a very significant need for methods and systems that address the above problems. In view of the foregoing, there is a need for methods and systems for compressing genomic data more optimally. Furthermore, there is a need for compressing genomic data using, for example, delta compression processes.

SUMMARY OF THE INVENTION

Consistent with embodiments of the present invention, systems and methods are disclosed for compressing and comparing genomic data.

In accordance with one embodiment, a method for compressing data comprises selecting a segment, creating a delta representation of the segment, the delta representation comprising a script, and storing the script.

According to another embodiment, a method for comparing data comprises receiving a first script comprising a compressed version of a first segment, receiving a second script comprising a compressed version of a second segment, comparing the first script to the second script, and determining if the first segment matches the second segments based upon the comparison of the first script to the second script.

In accordance with yet another embodiment, a system for compressing data comprises a memory storage for maintaining a database and a processing unit coupled to the memory storage, wherein the processing unit is operative to select a segment, create a delta representation of the segment, the delta representation comprising a script, and store the script.

In accordance with yet another embodiment, a system for comparing data comprises a memory storage for maintaining a database and a processing unit coupled to the memory storage, wherein the processing unit is operative to receive a first script comprising a compressed version of a first segment, receive a second script comprising a compressed version of a second segment, compare the first script to the second script, and determine if the first segment matches the second segments based upon the comparison of the first script to the second script.

In accordance with yet another embodiment, a computer-readable medium which stores a set of instructions which when executed performs a method for compressing data, the computer-readable medium executed by the set of instructions comprising selecting a segment, creating a delta representation of the segment, the delta representation comprising a script, and storing the script.

In accordance with yet another embodiment, a computer-readable medium which stores a set of instructions which when executed performs a method for comparing data, the computer-readable medium executed by the set of instructions comprising receiving a first script comprising a compressed version of a first segment, receiving a second script comprising a compressed version of a second segment, comparing the first script to the second script, and determining if the first segment matches the second segments based upon the comparison of the first script to the second script.

It is to be understood that both the foregoing general description and the following detailed description are exemplary and explanatory only, and should not be considered restrictive of the scope of the invention, as described and claimed. Further, features and/or variations may be provided in addition to those set forth herein. For example, embodiments of the invention may be directed to various combinations and sub-combinations of the features described in the detailed description.

BRIEF DESCRIPTION OF THE DRAWINGS

The accompanying drawings, which are incorporated in and constitute a part of this disclosure, illustrate various embodiments and aspects of the present invention. In the drawings:

FIG. 6 is a diagram showing a high level structure of a software program for extracting a delta representation of the segment consistent with an embodiment of the present invention;

FIG. 7 is a diagram showing a sample conversation between a client and a server consistent with an embodiment of the present invention;

FIG. 8 is a diagram showing an exemplary MUMmer output consistent with an embodiment of the present invention;

FIG. 10 is a diagram showing the mummer output shown in FIG. 8 translated to textual edit script consistent with an embodiment of the present invention;

FIG. 23 is a diagram showing the average of several tests in conjunction with a second operational example consistent with an embodiment of the present invention.

DETAILED DESCRIPTION

Figure 1:
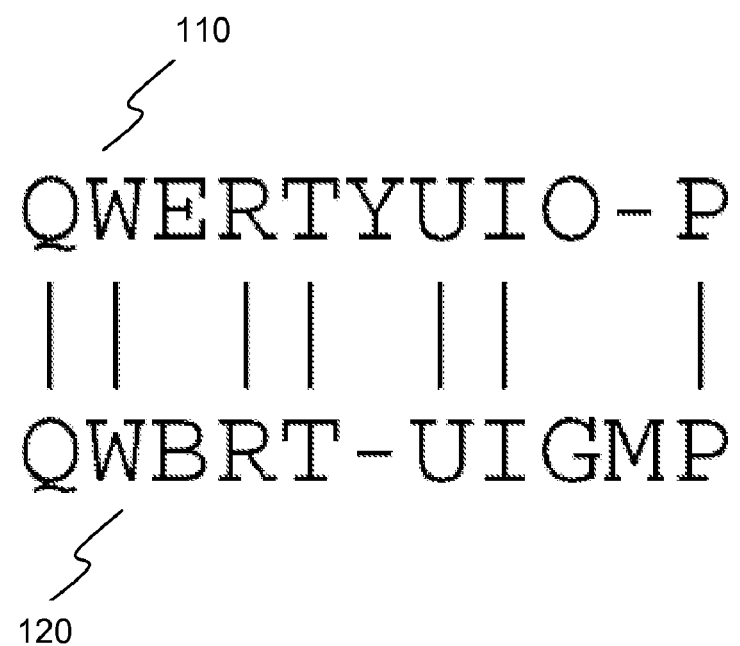
FIG. 1 is a diagram illustrating delta compression consistent with an embodiment of the present invention.

The following detailed description refers to the accompanying drawings. Wherever possible, the same reference numbers are used in the drawings and the following description to refer to the same or similar parts. While several exemplary embodiments and features of the invention are described herein, modifications, adaptations and other implementations are possible, without departing from the spirit and scope of the invention. For example, substitutions, additions or modifications may be made to the components illustrated in the drawings, and the exemplary methods described herein may be modified by substituting, reordering or adding steps to the disclosed methods. Accordingly, the following detailed description does not limit the invention. Instead, the proper scope of the invention is defined by the appended claims.

Systems and methods consistent with embodiments of the present invention may compress data such as genomic data. Consistent with an embodiment of the present invention, the space occupied by data, such as DNA sequences, may be reduced using, for example, delta compression technology thus addressing storage, I/O, and data transmission problems. For example, embodiments of the present invention may decrease both the space needed for data storage and the time needed for input/output and data exchange.

Because DNA sequencing technologies are becoming more available, there is a need to store and transmit very large volumes of DNA sequences efficiently. Furthermore, there is a need for algorithms and data structures capable of comparing large DNA sequences to each other on a large scale. Conventional DNA storage, transmission, and analysis methods are inadequate. Embodiments of the present invention may apply data compression technology to DNA sequences, offering a solution to the aforementioned problems. Furthermore, embodiments of the present invention may apply delta compression with indexed dictionaries to achieve high compression efficiency on DNA sequences.

DNA sequence compression with probabilistic variable-length encoding (Huffman), macro encoding with fixed length (using the Lempel-Ziv family of algorithms including Lempel-Ziv-Welch), or variable length internal dictionary (LZC) methods may be used. The average performance of these approaches may be approximately 1.8 bits/nucleotide. In some cases, for example, they may achieve 1.5 bit/per nucleotide. DNA sequences sampled from two humans in the general population may be more similar than different. For example, two such sequences may be 99.9% similar. Because delta compression exploits similarity to effect size reduction, this feature may allow delta compression to be efficiently used on DNA sequence data.

The efficiency of traditional compression techniques, collectively identified as textual substitution or macro encoding, lies in the fact that data streams may be serially compressed in terms of data previously seen by a compressor algorithm, for example. Repetitive data may thus be encoded via pointers to data that has already been seen by the compressor algorithm (and, analogously, by the decompressing algorithm). This approach may generate a virtual dictionary that may be encoded implicitly in the compressed data. Embodiments of the present invention may extend this concept by creating an explicit dictionary of substrings used in either insert or substitute operations. This explicit dictionary, for example, may augment the efficiency of the original delta compression idea by further reducing the space used for a delta compressed segment. For example, substrings used in insert or substitute operations may be each stored in the dictionary only once instead of being reiterated multiple times in an edit script. Embodiments consistent with the invention may serially build a dictionary and represent explicitly each substring once. Strings in the dictionary may be uniquely indexed by, for example, a message digest 5 (MD5) or hash code.

Moreover, further enhancements to the overall compression efficiency may be achieved by using, for example, an Lempel-Ziv recursive implicit substring representation. Whereas textual substitution (LZ77, LZ78, LZW and LZC algorithms) serially compress data with pointer referencing substrings that were already present in the data stream, the storage demand of the dictionary storage may be further reduced by encoding, whenever efficient, strings as sequences of explicit characters and pointers to substrings already present in the dictionary.

Delta compression compresses data, for example, by eliminating redundancy between a reference data set R, and a second data set V, known as the version, segment, or test. Delta compression uses substrings found in the reference string to compactly encode a version string that contains some of the same substrings. A string may comprise a contiguous series of characters and a substring may comprise a contiguous series of characters contained within the string. The differences (deltas) between the version and the reference may be recorded or stored.

FIG. 1 shows delta compression consistent with an embodiment of the present invention. For example, the origin of delta compression is in the string-to-string correction problem, which attempts to find the minimum cost of converting one string to another. The set of instructions for converting one string into the other is called an edit script. The edit distance (the Levenstein distance) is the sum of the costs of individual transformations. For example, as shown in FIG. 1, the two strings: R 110 (QWERTYUIOP) and V 120 (QWBRTUIGMP) are related and can be aligned. Given R 110, V 120 can be described by the series of operations on R:MMRMMDMMRIM, where M=match, R=replace, D=delete, and I=insert. If the cost of M is 0, and the cost of I, D or R is 1, the edit distance between R 110 and V 120 is 4. The string MMRMMDMMRIM is called an edit transcript, and comprises the instructions for creating V 120, given R 110. The FIG. 1 example shows that the relationship between R 110 and V 120, expressed as an edit transcript, may be derived from the alignment of the two strings. Delta compression extends aforementioned concept by matching entire strings that occur in both R 110 and V 120. These similarities are exploited to compress V 120, the degree of compression being proportional to the similarity between the sequences.

Figure 2:
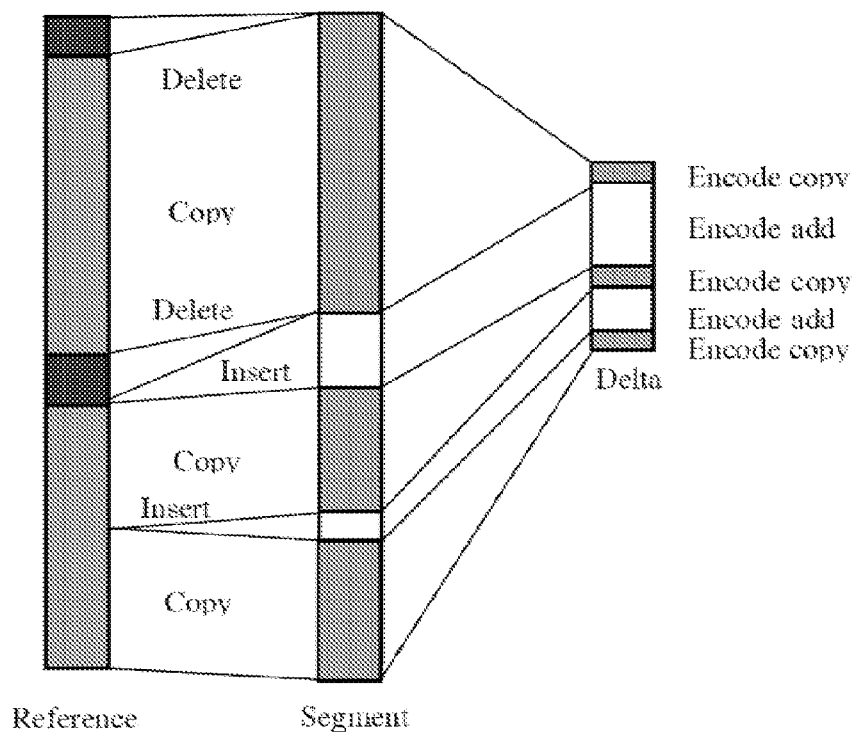
FIG. 2 is a diagram illustrating a delta compression example consistent with an embodiment of the present invention.

FIG. 2 shows an example of delta compression consistent with an embodiment of the present invention. Substrings found in a reference string may be used to compactly encode a version string that contains some of the same substrings. Substrings in the version that are found in the reference may be encoded as copy commands, where the elements of each block to be copied may be the start position on the reference and the length of the string to be copied. Strings not found in the reference are encoded as insert commands in which the string to be added is explicitly represented. A reconstruction algorithm can rebuild the version string by repeatedly copying substrings (specified by their coordinates) from the reference, and adding literal substrings specified by the delta string. FIG. 2 shows how the reference, a version, and their delta are related. Copy commands may use very little space (just two numbers, for example), whereas insert commands may simply be the strings not found in the reference. Consequently, the greater the similarity between the reference and version strings, the greater the compression that can be achieved. Given the similarity between randomly chosen human genomes, delta compression may yield a high degree of compression for DNA sequences.

Figure 3:
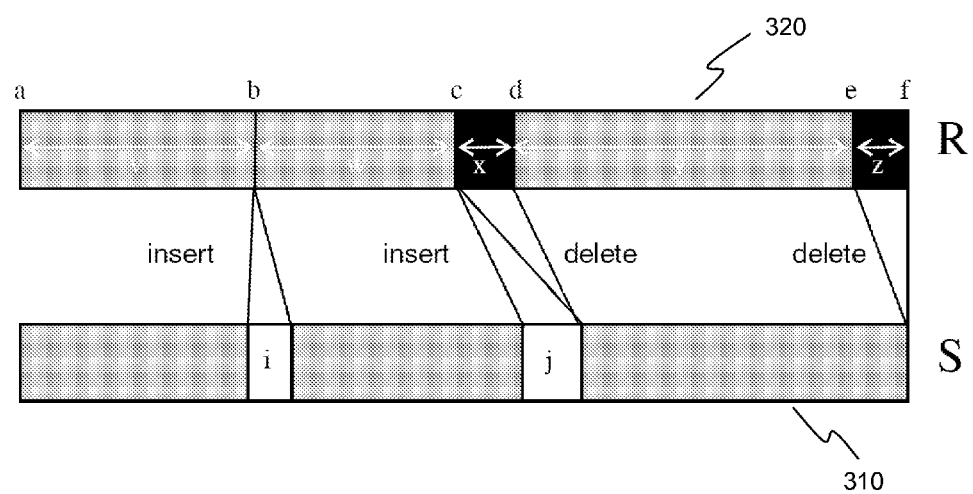
FIG. 3 is a diagram illustrating the delta compression example of FIG. 2 in more detail consistent with an embodiment of the present invention.

FIG. 3 shows the exemplary delta compression of FIG. 2 in more detail consistent with an embodiment of the present invention. The segment sequence S 310 may be identical to the reference sequence R 320 apart from two insertions and two deletions. One insertion and one deletion occur at the same position (c) on R 320 and together make up a substitution. Delta compression, for example, records S 310 in terms of how S 310 can be reconstructed using information contained in R 320. Parts of S 310 not contained in R 320 may be represented explicitly. Thus, the greater the similarity between S 310 and R 320, the smaller the delta and the greater the degree of compression. One way of representing a delta is as a series of insert and copy commands, wherein a copy command describes a string found in R 320 and S 310, and an insert command describes a string found in S 310 but not R 320. The delta of S 310 against R 320 shown in FIG. 3 can be written:

1. Copy v letters of R starting at a.
    2. Insert string i.
    3. Copy w letters of R starting at b.
    4. Insert string j.
    5. Copy y letters of R starting at d.

The above "insert/copy" or "I/C" representation has the advantage that the edit script can be written compactly, and is an explicit set of instructions for reconstructing S 310. As such, sequence reconstruction can be performed more quickly. However, deletions and substitutions are not explicitly represented and may be computed from the copy command boundaries. A delta may also be represented in terms of insertions, deletions, and substitutions. Using the data in FIG. 3, the same delta can be written:

1. At e, delete z letters.
    2. At c, delete x letters and insert string j.
    3. At b, insert string i.

The above example may be referred to as the "insert/delete/substitute" or "I/D/S" representation of a delta. While the I/C and I/D/S representations of deltas have different advantages, both may be used.

An embodiment consistent with the invention may comprise a system for compressing data. The system may comprise a memory storage for maintaining a database and a processing unit coupled to the memory storage. The processing unit may be operative to select a segment, create a delta representation of the segment, the delta representation comprising a script, and store the script. Another embodiment consistent with the invention may comprise a system for comparing data. The system may comprise a memory storage for maintaining a database and a processing unit coupled to the memory storage. The processing unit may be operative to receive a first script comprising a compressed version of a first segment and to receive a second script comprising a compressed version of a second segment. The processing unit may be further operative to compare the first script to the second script and to determine if the first segment matches the second segment based upon the comparison of the first script to the second script.

Figure 4:
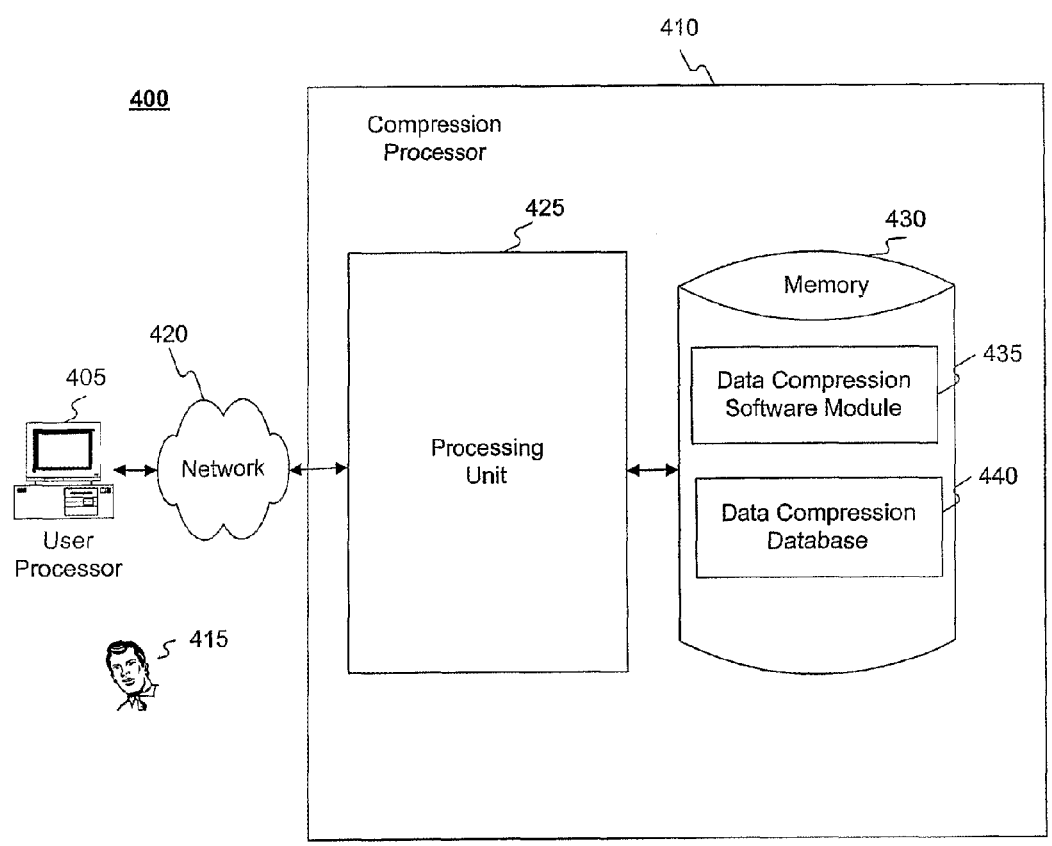
FIG. 4 is a block diagram of an exemplary data compression system consistent with an embodiment of the present invention.

Consistent with an embodiment of the present invention, the aforementioned memory, processing unit, and other components may be implemented in a data compression system, such as an exemplary data compression system 400 of FIG. 4. Any suitable combination of hardware, software and/or firmware may be used to implement the memory, processing unit, or other components. By way of example, the memory, processing unit, or other components may be implemented with any of a user processor 405 or compression processor 410, in combination with system 400. The aforementioned system and processors are exemplary and other systems and processors may comprise the aforementioned memory, processing unit, or other components, consistent with embodiments of the present invention.

Furthermore, the invention may be practiced in an electrical circuit comprising discrete electronic elements, packaged or integrated electronic chips containing logic gates, a circuit utilizing a microprocessor, or on a single chip containing electronic elements or microprocessors. The invention may also be practiced using other technologies capable of performing logical operations such as, for example, AND, OR, and NOT, including but not limited to mechanical, optical, fluidic, and quantum technologies. In addition, the invention may be practiced within a general purpose computer or in any other circuits or systems.

By way of a non-limiting example, FIG. 4 illustrates system 400 in which the features and principles of the present invention may be implemented. As illustrated in the block diagram of FIG. 4, system 400 may include user processor 405, compression processor 410, a user 415, and a network 420. User 415 may be an individual, for example, desiring to, compress or compare data using compression processor 410. User 415 may also be an organization, enterprise, or any other entity having such desires.

Compression processor 410 may include a processing unit 425 and a memory 430. Memory 430 may include a data compression software module 435 and a data compression database 440. Software module 435 residing in memory 430 may be executed on processing unit 425 and may access database 440 to implement, for example, the processes described below for compressing or comparing data. Consistent with the invention, however, software module 435 may implement other processes and may be implemented on other processors.

User processor 405 or compression processor 410 ("the processors") included in system 400 may be implemented using a personal computer, network computer, mainframe, or other similar microcomputer-based workstation. The processors may though comprise any type of computer operating environment, such as hand-held devices, multiprocessor systems, microprocessor-based or programmable sender electronic devices, minicomputers, mainframe computers, and the like. The processors may also be practiced in distributed computing environments where tasks are performed by remote processing devices. Furthermore, any of the processors may comprise a mobile terminal, such as a smart phone, a cellular telephone, a cellular telephone utilizing wireless application protocol (WAP), personal digital assistant (PDA), intelligent pager, portable computer, a hand held computer, a conventional telephone, or a facsimile machine. The aforementioned systems and devices are exemplary and the processor may comprise other systems or devices.

Network 420 may comprise, for example, a local area network (LAN) or a wide area network (WAN). Such networking environments are commonplace in offices, enterprise-wide computer networks, intranets, and the Internet, and are known by those skilled in the art. When a LAN is used as network 420, a network interface located at any of the processors may be used to interconnect any of the processors. When network 420 is implemented in a WAN networking environment, such as the Internet, the processors may typically include an internal or external modem (not shown) or other means for establishing communications over the WAN. Further, in utilizing network 420, data sent over network 420 may be encrypted to insure data security by using known encryption/decryption techniques.

In addition to utilizing a wire line communications system as network 420, a wireless communications system, or a combination of wire line and wireless may be utilized as network 420 in order to, for example, exchange web pages via the Internet, exchange e-mails via the Internet, or for utilizing other communications channels. Wireless can be defined as radio transmission via the airwaves. However, it may be appreciated that various other communication techniques can be used to provide wireless transmission, including infrared line of sight, cellular, microwave, satellite, packet radio, and spread spectrum radio. The processors in the wireless environment can be any mobile terminal, such as the mobile terminals described above. Wireless data may include, but is not limited to, paging, text messaging, e-mail, Internet access and other specialized data applications specifically excluding or including voice transmission.

System 400 may also transmit data by methods and processes other than, or in combination with, network 420. These methods and processes may include, but are not limited to, transferring data via diskette, CD ROM, facsimile, conventional mail, an interactive voice response system (IVR), or via voice over a publicly switched telephone network.

Figure 5:
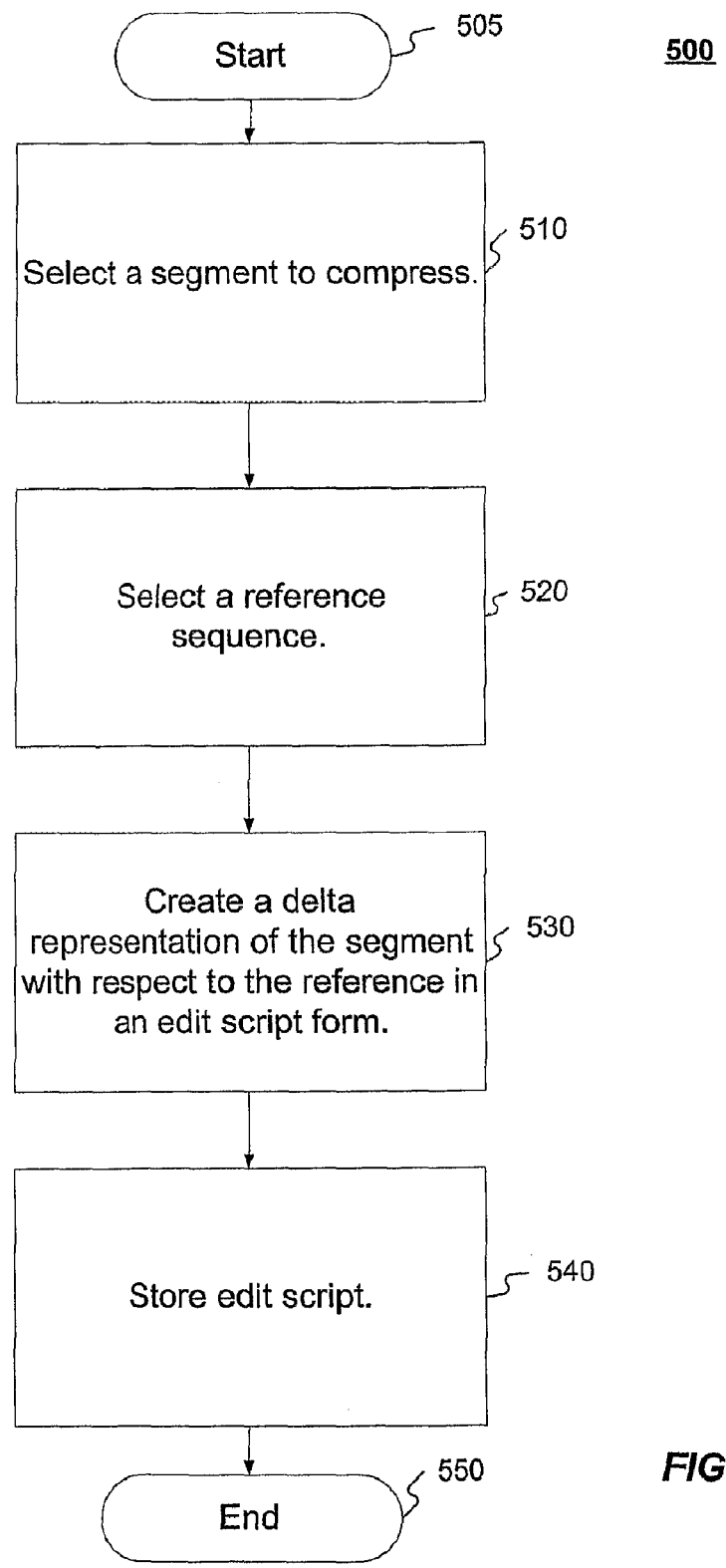
FIG. 5 is a flow chart of an exemplary method for compressing genomic data consistent with an embodiment of the present invention.

FIG. 5 is a flow chart setting forth the general stages involved in an exemplary method 500 consistent with the invention for compressing genomic data using, for example, system 400 of FIG. 4. Exemplary ways to implement the stages of exemplary method 500 will be described in greater detail below. Exemplary method 500 may begin at starting block 505 and proceed to stage 510 where compression processor 410 may select a segment to compress. For example, compression processor 410 may receive genomic data from user processor 405 over network 420. The genomic data may comprise a DNA sequence. Compression processor 410 may select a segment from the DNA sequence to compress. Genomic data is exemplary and other types of data may be used.

From stage 510, where compression processor 410 selects the segment to compress, exemplary method 200 may advance to stage 520 where compression processor 410 may select a reference sequence. For example, the reference sequence may be substantially similar to the segment. The reference sequence may comprise, for example, a completed human genome. DNA sequences sampled from two humans in the general population, for example, may be more similar than different. For example, two such sequences may be 99.9% similar. This feature may allow delta compression to be efficiently used on DNA sequence data compression. Accordingly, any incoming segment from human genomic data may be very similar to the reference when the reference, for example, is a completed human genome.

Once compression processor 410 selects the reference sequence in stage 520, exemplary method 500 may continue to stage 530 where compression processor 410 may extract a delta representation of the segment with respect to the reference. Compression processor 410 may extract the delta representation of the segment in, for example, edit script form. For example, conventional algorithms at least do not allow explicit extraction of an edit script in a form suitable (for example, in I/C or I/D/S format) for use in storing the segments. Embodiments of the present invention may use an algorithm to extract the delta and the encoding, for example, in either I/C or I/D/S format. There may be a trade-off between speed of extraction and optimality of the extracted edit script. Greedy algorithms may trade optimality of the script for speed of extraction, while heuristic and non-greedy, exhaustive-search algorithms may trade speed for optimality. Furthermore, the choice of encoding may have an effect on the compression ratio. I/D/S encoding may offer larger storage savings than I/C, whereas I/C may have the advantage of explicitly defining aligned substring between the segment and the reference.

The delta extraction process, for example, may be divided into two parts: i) exact match alignment; and ii) edit script generation. The exact match alignment part may identify the substrings common to the reference and segment sequences. For exact match alignment, the MUMmer software package, available form the Institute for Genomic Research of Rockville may be used. To generate the edit scripts, a "greedy" algorithm may be used, for example, that may encode all matching substrings as copy operations and all intervening substrings as insert operations. The Myers' approach may be used to extend, for example, a greedy algorithm to generate optimal scripts for the I/D/S format. The Myers' approach is described in E. Myers. An O(nd) difference algorithm and its variations. Algorithmica, 2(1):251. 266, 1986, which is incorporated herein by reference.

FIG. 6 shows a high level structure of a software program for extracting a delta representation of the segment with respect to the reference consistent with an embodiment of the present invention. The software program may comprise, but is not limited to software module 435 as described above with respect to FIG. 4. Such a program may collect and sort, for example, the output of the MUMmer program. (<Collect Uniquely Aligned Segments from MUMmer Output> and <Sort MUMmer Output>). Then the software program may resolve boundaries for overlapping aligned segments. (<Overlapping MUMs Resolution>). Next, the software program may output the edit script to a database, such as database 430, or other storage system. (<Delta Outputting Loop>). In the implementations this software program (using the Perl language, for example) the output of MUMmer may be collected, either by running a MUMmer command, compiled from the sources distributed by the MUMmer authors, or by querying a persistent MUMmer server.

The MUMmer command may align one sequence or a group of sequences to the reference sequence. In each run of the program MUMmer may construct a suffix tree of the reference sequence. The program may then compare this suffix tree to each query sequence. Furthermore, from the MUMmer source code, a version of MUMmer may be developed that loads a reference sequence, builds the suffix tree, and listens for connections from clients on a connection-oriented, internet domain, TCP/IP socket, for example. A persistent MUMmer server may utilize a conventional server-to-client-connection protocol. The server may open a listening socket on an arbitrary port and use a multi-threaded architecture to answer queries on that port. The main thread may create a pool of threads to answer the queries. The size of the pool may be established at compile-time, for example. After creation, the threads may be put in sleep mode and awakened by the main thread whenever an incoming query is received on the socket. Queries may be assigned to answering threads in a round-robin fashion, for example. When all threads are busy answering, the main thread may wait for the first thread to finish before assigning a new query.

FIG. 7 shows a sample conversation between a client and a server consistent with an embodiment of the present invention. The client may send a series of lines containing, for example, an identification (ID) for the query sequence, a length, and a "MINMATCH" parameter that may have the same meaning as the −1 parameter of the command line version. The −1 parameter is discussed in greater detail below. The answer from the MUMmer server may have the same format as the output provided by a MUMmer run as a command line program, for example, but without comments.

FIG. 8 shows an exemplary MUMmer output for comparing two sequences with matches that are unique on both consistent with an embodiment of the present invention. MUMmer may report all matching segments in the two sequences. Lines starting with the "#" or the ">" character may be comments and thus may be ignored. Each remaining line may contain three figures. The first one may indicate the coordinate of the unique matching segment on the first sequence, the second one may indicate the coordinate on the other sequence, and the third may indicate the length of the matching segment. The segments may be sorted according to the coordinate on the first sequence, in increasing order, for example.

Figure 9:
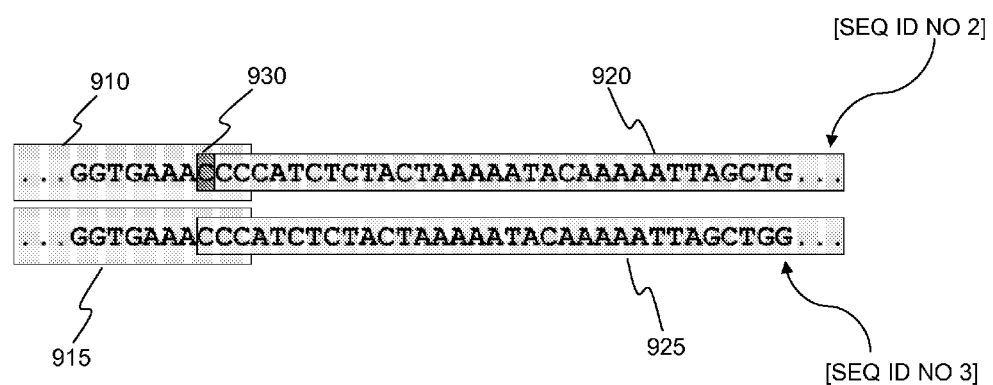
FIG. 9 is a diagram showing a sample case in which a fragment of two sequences (top and bottom) are aligned and matched consistent with an embodiment of the present invention.

FIG. 9 shows a sample case in which a fragment of two sequences (top and bottom) are aligned and matched by MUMmer consistent with an embodiment of the present invention. For example, some cases exist in which two unique matching segments are partially overlapping. The fragment contains two successive unique matching segments. Top and bottom sequences have been conveniently truncated left and right. Boxes 910 and 915 mark the boundaries of a first unique match. Boxes 920 and 925 mark the following match as identified by MUMmer, for example. Box 930 identifies the 'C' residue that is not present in the bottom sequence. In this circumstance (and analogous others), MUMmer has identified two unique matching segments that partially overlap in both sequences. The situation may arise from the deletion of the first 'C' residue in a short stretch of 4° C.'s, causing the second unique substring to overlap with the first one. In an edit script that reconstructs the bottom sequence from the first, this may resolve into two successive 'copy' operations, one terminating at the third 'C' residue on the top sequence, the other starting at the first 'A' residue following the 4 'C's cluster.

FIG. 10 shows the MUMmer output shown in FIG. 8 translated to textual edit script consistent with an embodiment of the present invention. For example, to extract an edit script in C/I format, the MUMmer output may be collected, either from a run of the basic command-line version or from a server as described above. The data may then be organized into an array of records. Each record may contain three fields: i) a coordinate on the reference sequence; ii) a coordinate on a segment sequence; and iii) a length of a matching substring. The records may be sorted again in increasing order according to their coordinate on the segment sequence. From the re-sorted set of matching substrings, another ordered set may be created in which all matching substrings may be encoded as copy operations. The sorting order of this @sorted_fields array may be preserved. From this @Commands ordered set, another one (@NewCommands) may then be created. This @NewCommands set of operations may encode gaps between copy operations as inserts, and disambiguates overlapping boundaries between copy operations, adding inserts at the boundaries as needed.

Beforehand, two special cases may be evaluated: i) if the @Commands operation set is empty (i.e. there are no matching substrings between the first and the second sequence file), the second sequence is encoded in the edit script as a single insert operation (the @NewCommands set will contain only one operation; and ii) if the @Commands set contains only one operation that spans the length of the second sequence, the two sequences are identical and thus the second is encoded as a long copy operation in the @NewCommands set. If the @Commands set contains more than one operation, or one that spans less than the size of the second sequence, the algorithm may scan all successive operations in the @Commands set. If there is a gap of more than one nucleotide, the algorithm may add an insert operation between the two copy operations. If two successive copy operations are overlapping, the algorithm may disambiguate the boundary by advancing the copy operation by a convenient number of bases and then adding an insert operation, if needed. If the @Commands set terminates at a nucleotide less than the length of the second sequence, an extra insert operation may be added at the end. The algorithm may then scan the just created @NewCommands ordered set, one operation at a time. Each operation may be sent to the database or other storage system in use, through, for example, a storage implementation-independent interface.

After compression processor 410 extracts the delta representation of the segment with respect to the reference in edit script form in stage 530, exemplary method 500 may proceed to stage 540 where compression processor 410 may store the edit script. Compression processor 410 may store the edit script in data compression database 440. For example, deltas may be stored as edit scripts. An edit script may comprise a series of commands that when applied to the reference sequence, transforms the reference into the segment. This may be a useful representation for saving storage space and reducing I/O and data transmission times.

Furthermore, embodiments of the invention may structure delta compressed data that may allow, for example, DNA sequences to be compared and aligned to one another in their compressed format. This may provide performance improvements in DNA comparison and alignment proportional to the degree of compression. For example, structures consistent with embodiments of the inventions may include those that represent deltas in computer memory, in relational and object-oriented databases, and as computer files. These structures may share the common feature that the delta-compressed version of a DNA sequence is comprised of an ordered series of features, wherein each feature is uniquely identifiable. Delta representations of similar DNA sequences may therefore be composed of similar series of features. A series of such features may be much smaller, depending on the degree of compression, than the original sequence.

Algorithms consistent with embodiments of the present invention may compare delta-compressed sequences in a fashion dependent on the lengths of the series of features comprising the input sequences. Embodiments of the invention may therefore demonstrate performance improvements over conventional processes that are dependent on the degree of compression. The discovery of knowledge embodied in DNA may be constrained by the speed with which DNA sequences may be analyzed. Accordingly, embodiments of the present invention may enable performance improvements in DNA sequence analysis.

As described above, C/I and I/D/S formats have different advantages and disadvantages. For example, DNA sequencing in the I/D/S format may have particularly advantages because the language of genetics may deal in rearranging DNA strings, all of which may be described in combinations of insertions, deletions, and substitutions. By uniquely encoding each insertion, deletion, and substitution, a delta may be created consisting of numbers representing each operation separated by numbers representing the absolute coordinates of each feature on R. As stated previously, the I/D/S representation of the delta shown in FIG. 3 may be described as follows.

1. At e, delete z letters.
2. At c, delete x letters and insert string j.
3. At b, insert string i.

If the above three operations were represented by their numbers (represented by the letters e, c, b, z, x, i) in the above edit script, the delta becomes the list: e,1,c,2,b,3. Confusion may arise because v, w, and z are numbers and there may be no way to distinguish between the code for a feature and a coordinate on R 320. Using negative numbers for the features may overcome this problem, for example, e,−1,c,−2,b,−3. Whenever a negative number in encountered, that number may encode an insertion, deletion, or substitution. A positive number may comprise a coordinate on R 320.

A refinement of this representation may be to use the intervals between features instead of the coordinates on R 320. The same can then be written, for example, v,−1,w,−2,y,−3. Both absolute and relative distances on R 320 may be useful. Using the intervals between the features, a sequence may be reconstructed by repeatedly jumping each relative distance along R 320, looking up the feature corresponding to the following negative number, and applying the operation to R 320. Accordingly, embodiments of the present invention may use a compact symbolic representation that can be used instead of a string. This "dictionary compression" offers further space savings.

Figure 11:
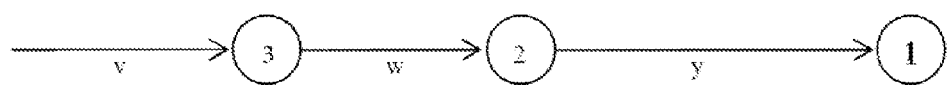
FIG. 11 is a diagram showing a delta representation as a graph consistent with an embodiment of the present invention.

FIG. 11 shows a delta representation as a graph consistent with an embodiment of the present invention. As shown in FIG. 11, edge weights (v, w, y) may be the distances between features. Node labels (3, 2, 1) may be unique encodings for insertion, deletion, and substitution operations. Representing deltas as insertions, deletions, and substitutions occurring at certain positions on R (for example, "I/D/S" format) allows deltas to be structured as strings and graphs, as described below with respect to FIG. 11. Representing deltas as strings and graphs may allow existing algorithms to be used to compare and align them in the compressed format. Furthermore, the I/D/S representation can also be formalized as a graph, where the features may be labeled nodes and the distances between features may be weighted edges as shown in FIG. 11. After compression processor 410 stores the edit script in stage 540, exemplary method 500 may then end at stage 550.

Structures for representing delta-compressed sequences were described above. These structures may be placed on storage media and may be used by programs for the manipulation, processing, and analysis of the deltas. Systems and methods consistent with embodiments of the present invention may also be used for persistent storage of delta-compressed sequences on storage media such as database 440 as described above. Theses systems and methods are described below.

Figure 12:
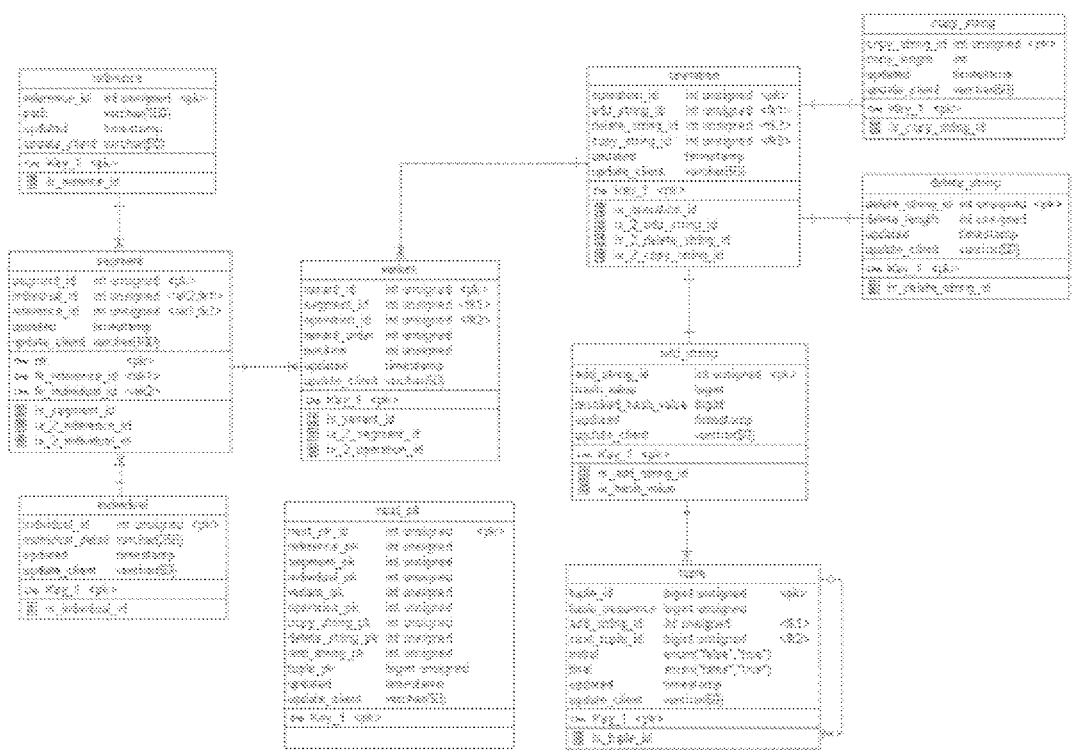
FIG. 12 is a diagram showing database schema for storing delta compressed sequences in the I/C format consistent with an embodiment of the present invention.

Consistent with an embodiment of the present invention a relational database for storage of the I/C representation of delta compressed sequences may be used. FIG. 12 shows database schema for storing delta compressed sequences in the I/C format. The schema shown in FIG. 12 may eliminate redundancy by implementing distinct tables for insert and copy operations (for example, add_string and copy_string tables.) Accordingly, any operation may be represented only once in the database. Additionally, the concept of an operation (insert or a copy, for example) may be represented by another table (operation table, for example) in order to provide a unique integer ID to each operation. For any DNA sequence (segment) that is compared to the reference, the delta set may be recorded as a set of rows in a variant table. These rows may consist of an ordered series of operations, wherein each operation may be a copy or insert operation. These operations may be retrieved in order from their respective tables to reconstruct the sequence. This schema may provide a simple representation of a delta set, consisting of a list of primary keys in the operation table.

Figure 13:
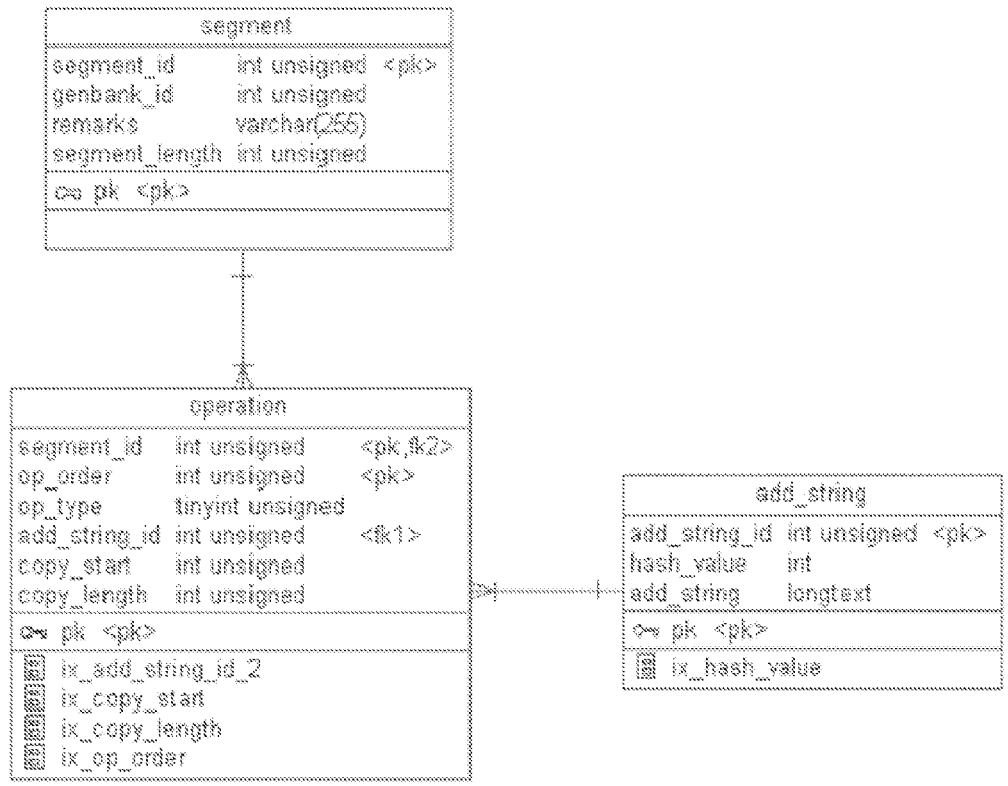
FIG. 13 is a diagram showing a simplified relational schema with copy string information stored in the operation table consistent with an embodiment of the present invention.

FIG. 13 shows a simplified relational schema with copy string information stored in the operation table consistent with an embodiment of the present invention. FIG. 13's schema may permit some redundancy in the database, while making use of some predictable traits of the data by caching common insert strings in memory to reduce the number of database lookups. Copy string operations may be recorded in an operation table. The segments recorded in the database may be in their own table (segment), each receiving a unique integer, plus a few other descriptive items. Insert strings may be recorded in their own table non-redundantly, meaning each insert string may be recorded only once, no matter, for example how many segments use that insert string.

Figure 14:
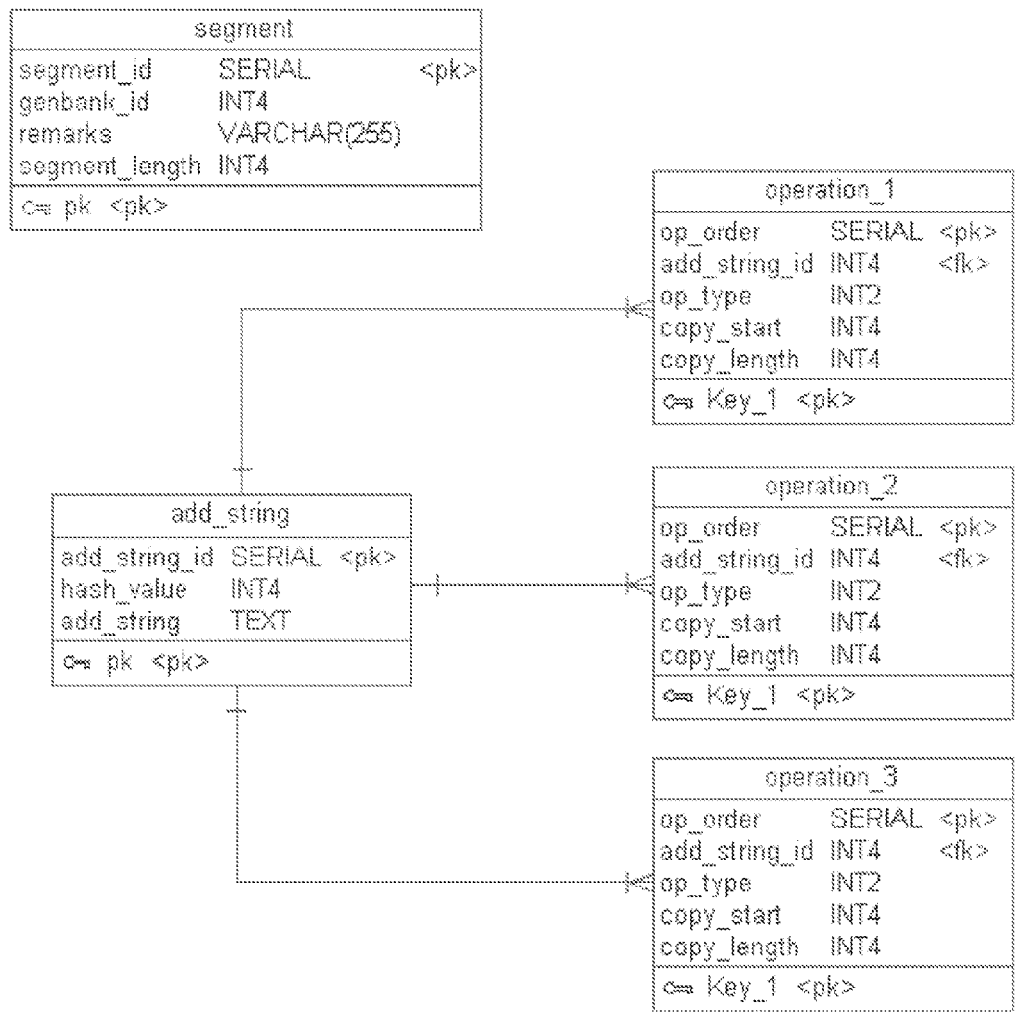
FIG. 14 is a diagram showing another database schema consistent with an embodiment of the present invention.

FIG. 14 shows another database schema consistent with an embodiment of the present invention. As shown in FIG. 14, an operation table, used to record the ordered insert and copy strings specifying how to reconstruct a segment, may be divided into multiple tables, one per segment, for example. Without this division, the operation table may grow very large, which may result in significant time penalty in retrieving the list of operations for any given segment. Dividing the table may eliminate this penalty. FIG. 14's schema may provide the space economies of a relational database by eliminating, for example, the greatest source of redundancy (in the insert strings), while permitting a small amount of redundancy in the copy string positions and lengths to boost performance.

Figure 15:
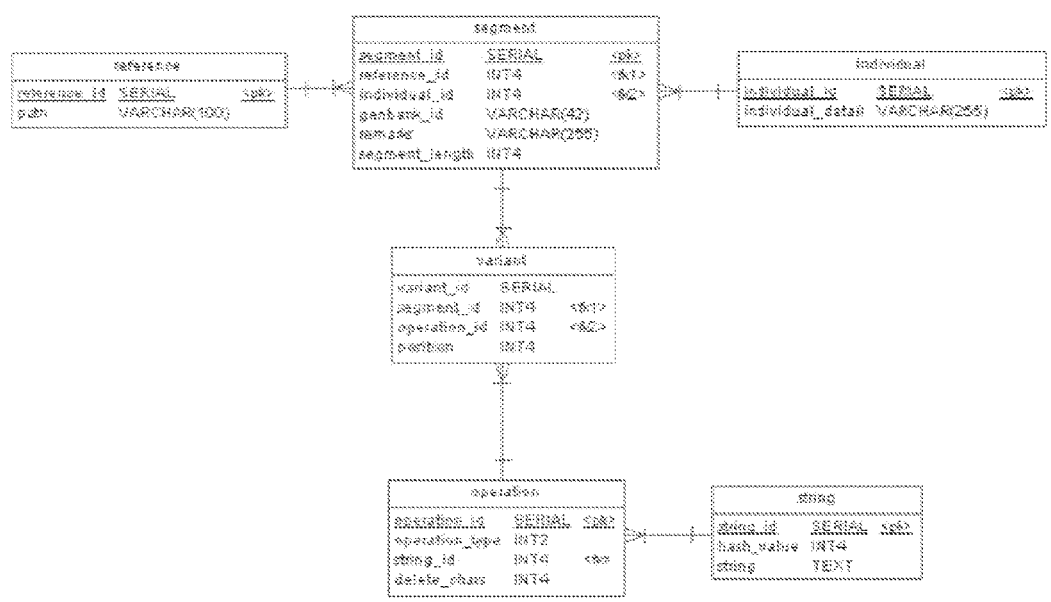
FIG. 15 is a diagram showing a relational schema for storage of delta compression sequences consistent with an embodiment of the present invention.

FIG. 15 shows relational schema for storage of delta compression sequences consistent with an embodiment of the present invention. As shown in FIG. 15, the database may store delta compressed DNA sequences using the I/D/S representation. A segment table may record information about each DNA segment stored as a delta-compressed sequence. The segment table may have a one-to-many relationship with a variant table. Insertions, deletions, and substitutions for a given segment each may have a row in the variant table. The operation table may record insertions, deletions, and substitutions. The operation_type field may record an integer, the value of which may indicate whether the row represents an insertion, deletion, or substitution. In the case of a deletion, the delete_chars field may indicate how many nucleotides to delete. The position at which to delete them may be given by the position field of the variant table. In the case of an insertion, the string to insert may be provided by a reference (string_id) to the string table. In the case of a substitution, characters may be deleted according to the delete_chars field and a string may be inserted at the same position, according to the string_id field. Operations may each be recorded once, and receive a unique integer identifier, the operation_id, for example. A segment may be described by a list of operation_id references in the variant table, where each operation_id may specify an insertion, deletion, or substitution occurring at a position on the reference sequence specified by the position field. The string table may record a unique identifier for each string used in an insertion or substitution, the string, and a hash value, which is an integer resulting from applying a hashing function to the string. This design may also include a reference table that may allow more than one reference sequence to be used for delta compression. Furthermore, this design may also include an individual table that may record information about a subject from whom each segment was obtained.

Moreover, flat file storage may be used to store delta compressed genomes via a tailored application. A relational database management system (RDBMS) may provide robust generic mechanism of storing data that may provide data integrity. This benefit may come at the expense of some overhead in space and performance. Very effective storage of delta compressed genomic sequences may be achieved with, for example, a software application that minimizes these overheads. This application may use minimal storage space. For example, one file may be used for saving global variables, two files may be used for saving the string tables of the I/C format (the "substring dictionary"), and one file may be used or each compressed genomic sequence. Consistent with an embodiment of the present invention global file may store information that helps track the state of the application between executions, namely the filenames of the other storage files and a quantity that records the topmost unused identification number for substrings in the substring dictionary. The dictionary may be stored in two files that use a 'key-value' mechanism to store the relationship between a substring and the unique id. Key-value databases are widely available as link libraries (some examples are the Berkeley db, tdbm, ndbm, the GNU gdbm). The key-value library layer takes care of computing the hash number of the stored string and provides fast access. The layer also takes care of resolving hash collisions. This application may delegate hash number generation and collision detection and resolution to the underlying key-value libraries.

Figure 16:
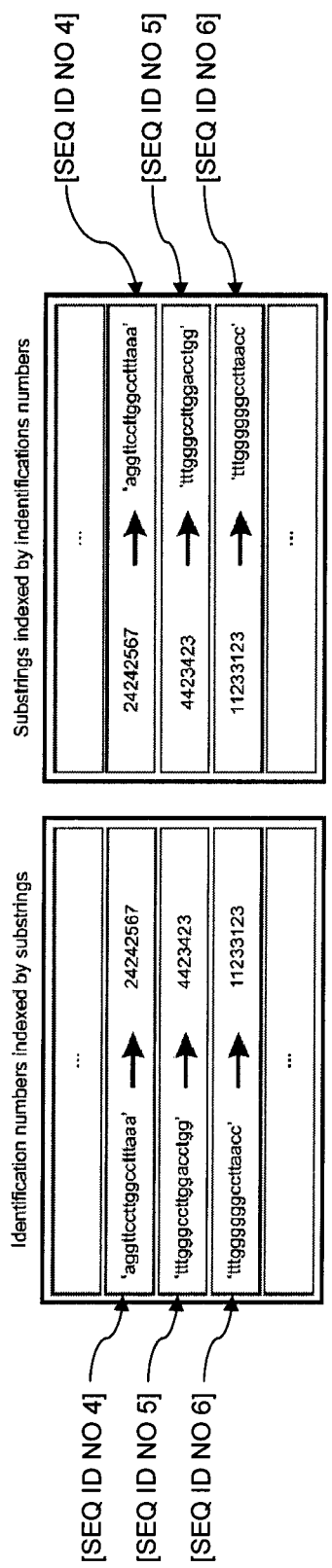
FIG. 16 is a diagram showing a two key-value databases that may be used to store and retrieve substrings with their unique identification number consistent with an embodiment of the present invention.
Figure 17:
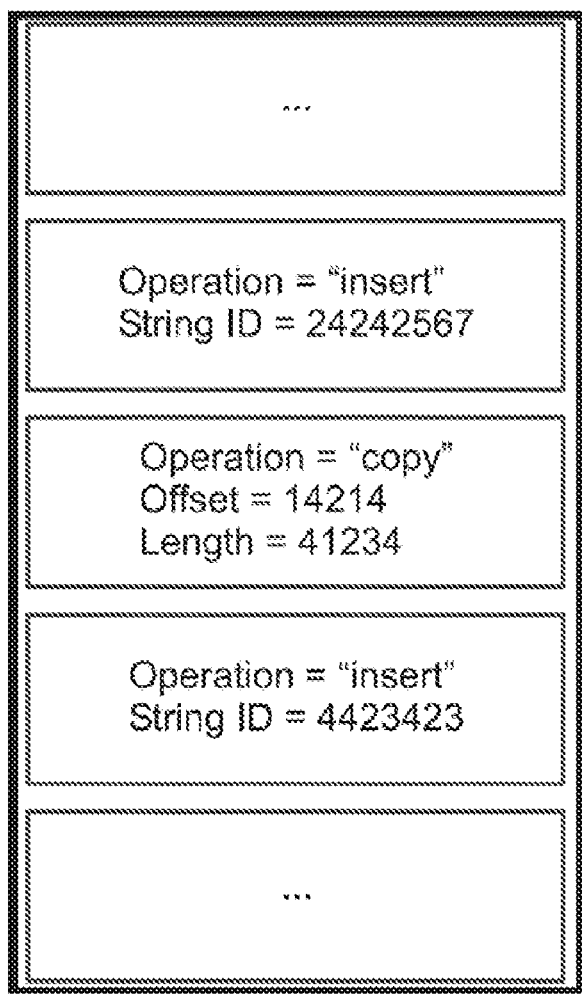
FIG. 17 is a diagram showing quantities that may be compactly stored in a homogeneous record of fixed size consistent with an embodiment of the present invention.

FIG. 16 shows a two key-value databases that may be used to store and retrieve substrings with their unique identification number consistent with an embodiment of the present invention. In the first key-value database, identification numbers may be indexed by substrings and in the second one, substrings may be indexed by identification numbers. Thus, any substring may be uniquely retrieved by the identification number, and vice-versa. Identification numbers may be assigned sequentially to substrings, beginning with 0, for example. Every time a new identification number is assigned, the next unused identification number may be increased by 1 to provide a unique identification for the next substring. Genomic sequences may be stored in files as a sequence of records, each of these records may contain: i) offset (position on the reference) and length for copy operations; ii) a substring identifier for insert operation; iii) a length for delete operations; and iv) a length and a substring identifier for substitute operations. All these quantities may be compactly stored in a homogeneous record of fixed size as shown in FIG. 17, such that a software application, for example, may read/write records serially, at constant boundaries, irrespective of the type of operation. To disambiguate among all the operations, an extra quantity signifying the type of operation (insert, delete, or substitute) may be stored in each record. The same storage paradigm may be used for either the I/C format, or the I/D/S format encoding.

Figure 18:
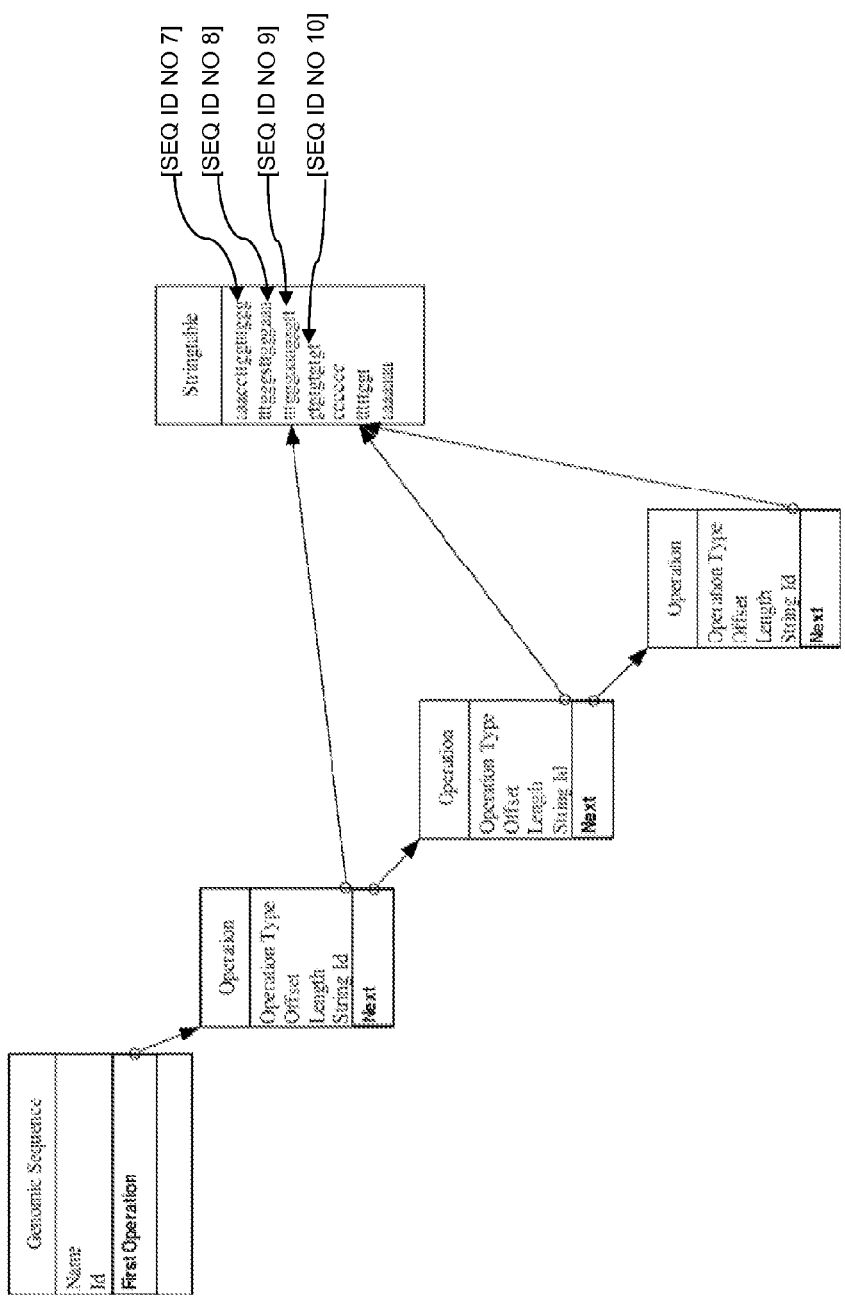
FIG. 18 is a diagram showing operations that may require the definition of a substring consistent with an embodiment of the present invention.

An object-oriented database may be used to store the representation of delta-compressed sequences. Object-oriented database management systems (OO-DBMS) may offer the advantage of basing the database schema on software objects instead of database tables. This database may be embodied through the definitions of two objects (for example, genomic sequence object and an operation object) and the substring dictionary. The first object (a genomic sequence object) may identify the genomic sequence and may relate the sequence to the first instance of the second object. The operation object may atomically define a single delta operation homogeneously for all the operation types. The operation class may contain the attributes needed by all operation types. An edit script may be uniquely identified by a series of instances of the operation class. Each instance may point to the next operation in a "linked list" fashion. Operations that may require the definition of a substring, may point directly to a member of the substring dictionary structure, as shown in FIG. 18. Sequence storage may be attained by initiating a new genomic sequence object and initiating an operation object for each delta operation in the sequence edit script. Substrings may be pointed to or added in the substring dictionary as needed. Sequence retrieval may be attained by following the list of operation object instances and reconstructing the original sequence.

First Operational Example

Figure 19:
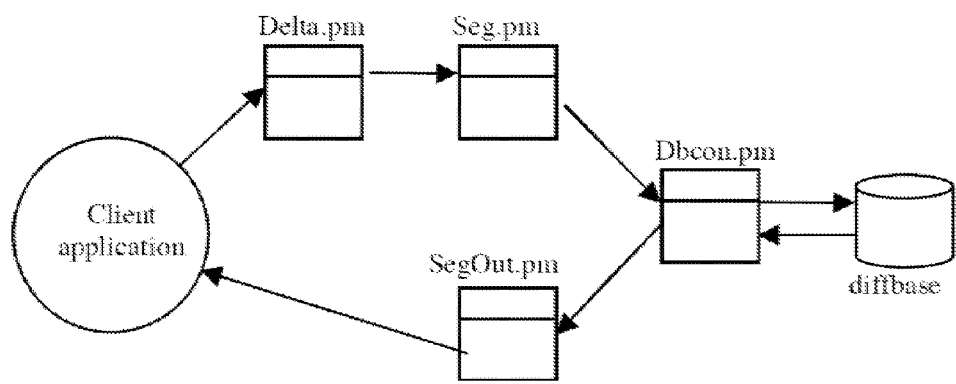
FIG. 19 is a diagram showing a modular structure of an exemplary software program for populating a database and testing storage performance consistent with an embodiment of the present invention.

FIG. 19 shows a modular structure of an exemplary software program for populating a database and testing storage performance consistent with an embodiment of the present invention. For example, the program may be written in object-oriented language such as Perl. An object oriented design may be used, for example, to maximize reusability of the code. The design may also accommodate likely alterations to the architecture such as changing the delta extraction algorithm or the database management system. A database may be populated with approximately 300 segments each differing from the chromosome 22 reference sequence by 0.1%. The 0.1% divergence level may be chosen because this may be what is generally reported to be the average difference between two genomes chosen at random from the population. The measurement of database compression performance may be a literal measurement of bytes required on disk for example. However, the following equation may help with overall understanding of the observed performance where:

$$C = \frac{1 + N \times c}{N} \quad (1)$$

C is the overall database space required for N segments as a fraction of their equivalent flat files;
1 represents the reference sequence;
N is the number of sequences in the database; and
    c is the average space required for the edit script of a segment as a fraction of the equivalent flat file.

This may be the simplest case where each segment is approximately the same size as the reference, the situation that may occur when sequencing whole chromosomes. The segments may compress, for example, on average to 0.05 times the size of their flat files. For the first sequence, the total data size may be 1.05 times the segment size, an actual increase. For the tenth segment the total data size may be 0.15 times the sum of the sizes of the segments. For the hundredth segment the total data size may be 0.06 times the sum of the sizes of the segments. For the thousandth segment the total data size may be 0.051 times the sum of the sizes of the segments. As illustrated in this example, the data size gradually decreases as N increases, approaching asymptotically, for example, 0.05. Accordingly, the compression performance of the system may become greater as the number of segments increases. There may be, for example, some general schema overhead, consisting in this example of the 87,380 frequently observed add strings that may be preloaded into the database for speed, and segment specific schema overhead, consisting in this example of the operation table created for each new segment. Taking this into account, equation 1 can be restated as:

$$C = \frac{R}{\sum_{1}^{N} S_i} + \frac{O_g}{\sum_{1}^{N} S_i} + \frac{\sum_{1}^{N}(O_i + C_i)}{\sum_{1}^{N} S_i} \quad (2)$$

where R is the size of the reference sequence, $S_i$ is the size of the $i^{th}$ sequence, $C_i$ is the size compressed as an edit script, $O_g$ is the general (segment-independent) schema overhead (mainly space occupied by pre-loaded, commonly used strings in the add_string table), and $O_i$ is the per segment schema overhead (mainly space required for each operation table and indices).

Figure 20:
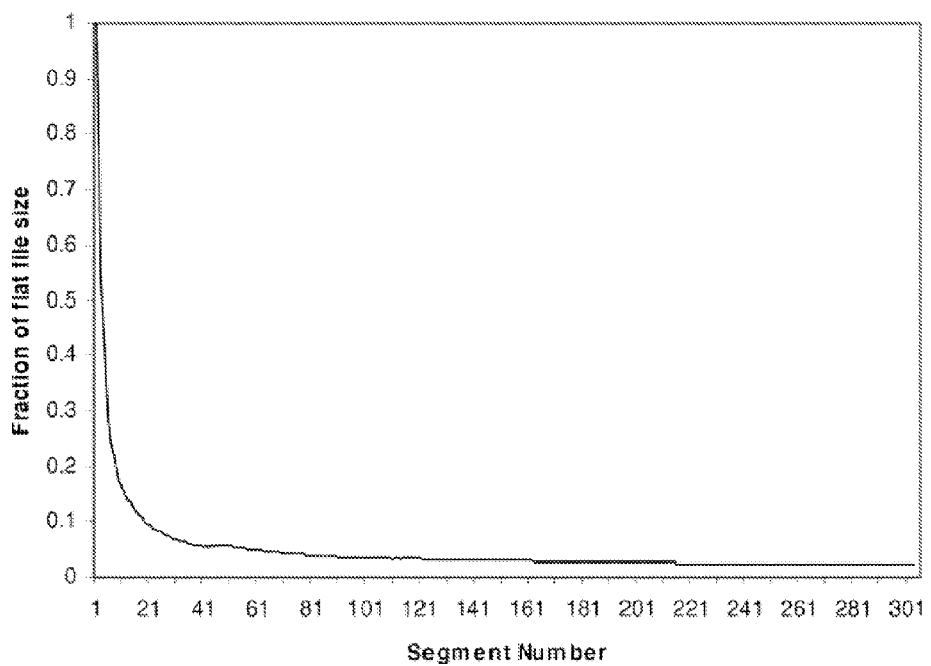
FIG. 20 is a diagram showing data for 300 simulated segments each diverging from the reference consistent with an embodiment of the present invention.
Figure 21:
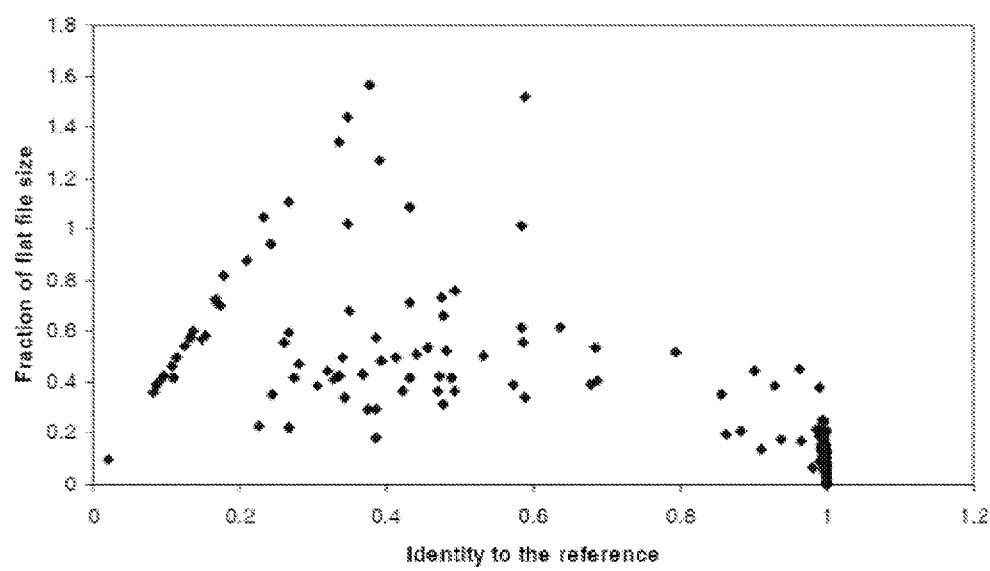
FIG. 21 is a diagram showing the results of chromosome 22 real data graphically consistent with an embodiment of the present invention.
Figure 22:
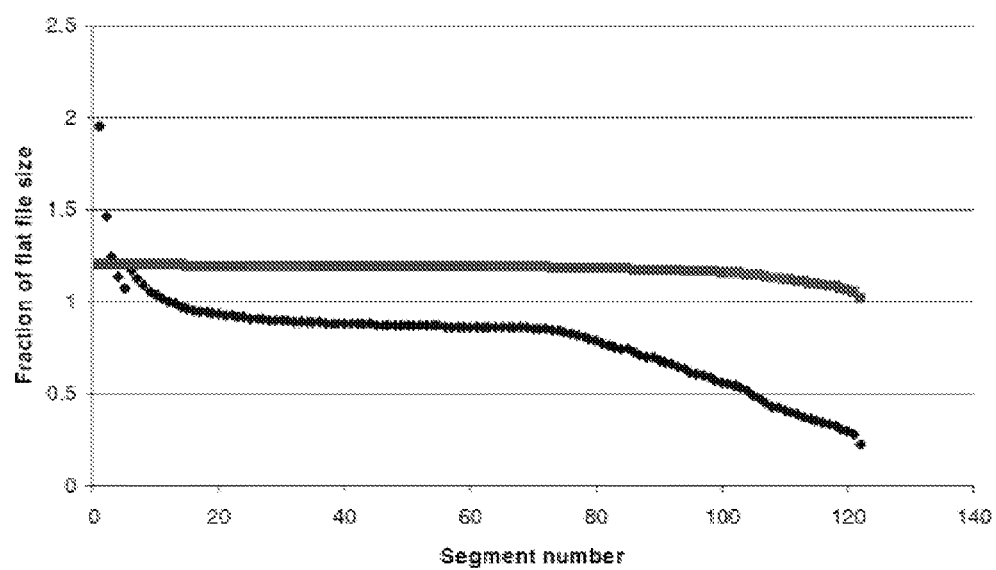
FIG. 22 is a diagram showing the performance of an exemplary system consistent with an embodiment of the present invention.

FIG. 20 shows data for 300 simulated segments each diverging from the reference by 0.1% (99.9% identity) consistent with an embodiment of the present invention. The asymptotic behavior noted above is shown with an overall compression performance of approximately 2%. This was calculated taking into account the schema overhead space required for tables, and indices, for example. A comparable set of real human data may be used to confirm these results. Multiple independently sequenced whole chromosomes, however, are not currently available to perform such a test. Furthermore, most of the chromosome 22 genomic sequences available from GenBank at the National Center for Biotechnology Information of Bethesda, Md., were actually used for building the human genomic sequence. Accordingly, an alternative was sought. The NCBI Entrez map viewer available from the University of North Carolina, Chapel Hill, N.C., offers genomic sequences that were not used for building the draft genome, through the "GenBank DNA" feature. This map viewer claims that all such sequences are longer than 500 bp and have at least 97% identity to sequences comprising the genome build in a span at least 98 nucleotides long. The sequences contained within the 23 Mbp NT_011520 chromosome 22 contig were identified using the coordinates of the contig and coordinates of each sequence in the list. The characteristics of this data set, however, may show that this data set is a poor test to be used with this example. The set spanned by the reference contig contains 2932 sequences in the size range 102-909203 bp (2291 of these sequences are shorter than 500 bp.) Nonetheless, the delta compression software of this example was applied to these sequences. For the total set of 2932 segments in this example the compression performance, defined as bytes on disk occupied by the edit scripts as a percentage of the bytes on disk occupied by the sequence files, was 3.7%. Because this example is not concerned with short sequences, the 199 sequences longer than 8000 bp were selected. FIG. 21 shows the results of this example graphically. As shown in FIG. 21, the compression performance of selected sequences is plotted (space occupied by each edit script as a fraction of space occupied by each sequence file) against identity to the reference.

Second Operational Example

A test may be performed to evaluate the performance of querying the database for an exact match between two sequences, versus comparing the same two sequences in a database of common use (GenBank for example), and versus comparing two flat files (also of the fully specified sequences). In order to perform the tests, a series of programs may be written and optimized, for maximum performance. The tests were run on a 2.4 GHz Pentium 4 Workstation, 1 GB of RAM running a recent version (2.6) of the Linux Operating system. Perl was used as the programming language of choice, being widely accepted and used in the biocomputing community. The C Language was later used to further explore the performance of the system and evaluate the amount of overhead added by the Perl interpreter and libraries.

Comparison in the database was performed by aligning and matching insert and copy operations of the edit scripts of the two sequences. Insert operations point to an entry in the add_string table (see above), and if two insert operations are determined to be referring to the same entry in the add_string table, they are considered matching. Copy operations were compared by matching their start and end coordinates. In case both coordinates were the same, the copy operations were considered the same. The system allows for very fast operations as copy and insert operations spanning any amount of nucleotides that can be checked for matching just by two comparisons (in the case of a copy) or one (in the case of an insert). Flat file comparisons were achieved by loading into RAM both sequences and comparing the two memory regions by using the fastest (depending on implementations) between strcmp( ) and memcpy( ) for C language, and the string comparison operator (which makes use of the strcmp( ) c function) for Perl. Analogously, two exact matching GenBank sequences were loaded via the BioPerl library from the GenBank main website, loaded in volatile memory and compared via Perl comparison operators as above.

FIG. 23 shows the average of several tests in conjunction with the second operational example consistent with an embodiment of the present invention. The timings may be divided into "General I/O" and "Comparison". General I/O includes, for example, the time required to load files (pure input/output) and time spent in libraries (either system or language-specific libraries) or overhead due to the multitasking nature of the operating system. The comparison includes only time spent in evaluating the match between two sequences. When examining flat files, two distinct copies of the same sequence (from Gen Bank) were used to avoid a confounding effect due to the I/O buffering. Re-reading the same file a second time with OS caching would have taken minimal to zero time. When accessing files directly in GenBank, the same sequence was accessed twice, as no caching is present when using TCP/IP sockets.

The initial tests of accessing GenBank data show that the timing of querying a remote database is affected by I/O TCP/IP sockets usage. Almost three minutes are required to load into memory the two sequences to be compared. The Perl program querying GenBank is easily outperformed by an analogous Perl program querying the delta database as the I/O time of the latter is just a fraction of a second (the time required to execute two SQL queries to retrieve the two sequences). The Perl program querying the database outperformed also an analogous Perl program matching two (identical) flat files. Again, even in the flat file case, the I/O is the bottleneck—the comparison is very fast due to the use of algorithms in memcmp( ) and strcmp( ) that take advantage of the 1st and 2nd level caches of the Pentium 4 processor. Similar conclusions can be drawn from C languages programs, with some surprise that the time spent in I/O by the C program comparing flat files is larger than the one spent by an analogous program written in Perl. The C libraries for reading FASTA formatted files have probably not yet reached the level of optimization of the Bioperl libraries.

The results confirm that comparing two sequences for an exact match in the database is faster than conventional matching processes. This is because, for example, comparing two delta encoded sequences is essentially a comparison of a set of integers representing the copy and insert operations, whereas conventional processes compare the two sequences byte-by-byte.

While certain features and embodiments of the invention have been described, other embodiments of the invention will be apparent to those skilled in the art from consideration of the specification and practice of the embodiments of the invention disclosed herein. Furthermore, although embodiments of the present invention have been described as being associated with data stored in memory and other storage mediums, one skilled in the art will appreciate that these aspects can also be stored on or read from other types of computer-readable media, such as secondary storage devices, like hard disks, floppy disks, or a CD-ROM, a carrier wave from the Internet, or other forms of RAM or ROM. Further, the steps of the disclosed methods may be modified in any manner, including by reordering steps and/or inserting or deleting steps, without departing from the principles of the invention:

It is intended, therefore, that the specification and examples be considered as exemplary only, with a true scope and spirit of the invention being indicated by the following claims and their full scope of equivalents.

What is claimed is:

1. A method for comparing nucleic acid sequences, the method comprising:
   receiving a first script comprising a delta representation of a first segment relative to a common reference segment, wherein the first segment comprises a nucleic acid sequence;
   receiving a second script comprising a delta representation of a second segment relative to the common reference segment, wherein the second segment comprises a nucleic acid sequence;
   comparing the first script to the second script using a computer processor; and
   determining if the nucleic acid sequence of the first segment matches the nucleic acid sequence of second segment based upon the comparison of the first script to the second script.

2. The method of claim 1, wherein at least one of the first segment and the second segment includes human genomic data.

3. The method of claim 1, wherein at least one of the first segment and the second segment includes deoxyribonucleic acid data.

4. The method of claim 1, wherein the common reference segment comprises a completed human genome.

5. The method of claim 1, wherein the common reference segment comprising a nucleic acid sequence.

6. The method of claim 1, wherein at least one of the first script and the second script is configured to indicate at least one operation.

7. The method of claim 1, wherein at least one of the first script and the second script is configured to indicate at least one operation comprising one of insert, delete, substitute, and copy.

8. The method of claim 1, wherein at least one of the first script and the second script comprises at least one symbol, the at least one symbol being configured to be looked-up in a dictionary to indicate a feature associated with the at least one symbol.

9. The method of claim 1, wherein at least one of the first script and the second script comprises at least one symbol, the at least one symbol being configured to be looked-up in a dictionary to indicate an operation associated with the at least one symbol, the operation comprising one of insert, delete, substitute, and copy.

10. A system for comparing data, the system comprising:
    a memory storage for maintaining a database; and
    a processing unit coupled to the memory storage, wherein the processing unit is operative to
    receive a first script comprising a delta representation of a first segment relative to a common reference segment;
    receive a second script comprising a delta representation of a second segment relative to the common reference segment;
    compare the first script to the second script; and
    determine if the first segment matches the second segments based upon the comparison of the first script to the second script.

11. The system of claim 10, wherein at least one of the first segment and the second segment includes genomic data.

12. The system of claim 10, wherein at least one of the first segment and the second segment includes human genomic data.

13. The system of claim 10, wherein at least one of the first segment and the second segment includes deoxyribonucleic acid data.

14. The system of claim 10, wherein the common reference sequence comprises a completed human genome.

15. The system of claim 10, wherein the common reference sequence comprises a nucleic acid sequences.

16. The system of claim 10, wherein at least one of the first script and the second script is configured to indicate at least one operation.

17. The system of claim 10, wherein at least one of the first script and the second script is configured to indicate at least one operation comprising one of insert, delete, substitute, and copy.

18. The system of claim 10, wherein at least one of the first script and the second script comprises at least one symbol, the at least one symbol being configured to be looked-up in a dictionary to indicate a feature associated with the at least one symbol.

19. The system of claim 10, wherein at least one of the first script and the second script comprises at least one symbol, the at least one symbol being configured to be looked-up in a dictionary to indicate an operation associated with the at least one symbol, the operation comprising one of insert, delete, substitute, and copy.

20. A non-transitory computer-readable medium which stores a set of instructions which when executed performs a method for comparing data, the computer-readable medium executed by the set of instructions comprising:
    receiving a first script comprising a delta representation of a first segment relative to a common reference segment;
    receiving a second script comprising a delta representation of a second segment relative to the common reference segment;
    comparing the first script to the second script; and
    determining if the first segment matches the second segments based upon the comparison of the first script to the second script.

21. The computer-readable medium of claim 20, wherein at least one of the first segment and the second segment includes genomic data.

22. The computer-readable medium of claim 20, wherein at least one of the first segment and the second segment includes human genomic data.

23. The computer-readable medium of claim 20, wherein at least one of the first segment and the second segment includes deoxyribonucleic acid data.

24. The computer-readable medium of claim 20, wherein the common reference sequence comprises a completed human genome.

25. The computer-readable medium of claim 20, wherein the common reference sequence comprises a nucleic acid sequences.

26. The computer-readable medium of claim 20, wherein at least one of the first script and the second script is configured to indicate at least one operation.

27. The computer-readable medium of claim 20, wherein at least one of the first script and the second script is configured to indicate at least one operation comprising one of insert, delete, substitute, and copy.

28. The computer-readable medium of claim 20, wherein at least one of the first script and the second script comprises at least one symbol, the at least one symbol being configured to be looked-up in a dictionary to indicate a feature associated with the at least one symbol.

29. The computer-readable medium of claim 20, wherein at least one of the first script and the second script comprises at least one symbol, the at least one symbol being configured to be looked-up in a dictionary to indicate an operation associated with the at least one symbol, the operation comprising one of insert, delete, substitute, and copy.

* * * * *

UNITED STATES PATENT AND TRADEMARK OFFICE
CERTIFICATE OF CORRECTION

PATENT NO. : 8,340,914 B2
APPLICATION NO. : 11/667264
DATED : December 25, 2012
INVENTOR(S) : Joe M. Gatewood et al.

It is certified that error appears in the above-identified patent and that said Letters Patent is hereby corrected as shown below:

Claim 15, Col. 23, Line 4, "sequences" should read --sequence--.

Claim 25, Col. 24, Line 15, "sequences" should read --sequence--.

Signed and Sealed this
Nineteenth Day of March, 2013

Teresa Stanek Rea
*Acting Director of the United States Patent and Trademark Office*